(12) United States Patent
Chilakapati et al.

(10) Patent No.: US 8,503,695 B2
(45) Date of Patent: Aug. 6, 2013

(54) SUPPRESSING OUTPUT OFFSET IN AN AUDIO DEVICE

(75) Inventors: Uma Chilakapati, San Diego, CA (US); Seyfollah Bazarjani, San Diego, CA (US); Joseph Fitzgerald, San Diego, CA (US); Guoqing Miao, San Diego, CA (US); Hui-Ya Nelson, San Diego, CA (US); Khalid Sidiqi, San Diego, CA (US); Jeffrey Hinrichs, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1023 days.

(21) Appl. No.: 12/237,786

(22) Filed: Sep. 25, 2008

(65) Prior Publication Data

US 2009/0103750 A1 Apr. 23, 2009

Related U.S. Application Data

(60) Provisional application No. 60/976,334, filed on Sep. 28, 2007.

(51) Int. Cl.
*H04B 15/00* (2006.01)
(52) U.S. Cl.
USPC .......... 381/94.5; 381/94.1; 341/120; 341/118
(58) Field of Classification Search
USPC .................... 381/94.1, 94.4; 341/120, 118
See application file for complete search history.

(56) References Cited

U.S. PATENT DOCUMENTS

| 5,087,914 | A | * | 2/1992 | Sooch et al. ............. 341/120 |
| 5,248,970 | A | | 9/1993 | Sooch et al. |
| 5,818,370 | A | | 10/1998 | Sooch et al. |
| 6,332,071 | B1 | | 12/2001 | Brandt |

FOREIGN PATENT DOCUMENTS

| CN | 1258874 A | 7/2000 |
| CN | 1304560 A | 7/2001 |
| GB | 2261336 | 5/1993 |

OTHER PUBLICATIONS

International Search Report and Written Opinion—PCT/US2008/078000, International Search Authority—European Patent Office—Feb. 4, 2009.
Taiwan Search Report—TW097137359—TIPO—Jan. 28, 2012.

* cited by examiner

*Primary Examiner* — Long Pham
(74) *Attorney, Agent, or Firm* — Espartaco Diaz Hidalgo

(57) ABSTRACT

A digital offset is combined with an audio signal in the digital domain to cancel an output offset caused by one or more analog components processing the same audio signal. In this manner, the offset at the output of the audio signal path (e.g., at a power amplifier output) is reduced or eliminated. Consequently, audible artifacts, such as click-and-pop artifacts, can be reduced or eliminated. In audio devices operating in ground-referenced capless mode, power consumption is reduced because of reduced or eliminated direct current (DC) leakage current through speakers or headsets of such audio devices. In some circumstances, the digital offset in the digital domain may be applied at substantially all times of operation of the audio signal path.

37 Claims, 4 Drawing Sheets

SUPPRESSING OUTPUT OFFSET IN AN AUDIO DEVICE

CLAIM OF PRIORITY UNDER 35 U.S.C. §119

The present Application for patent claims priority to Provisional Application No. 60/976,334, entitled "Apparatus and Methods for Reducing Output Offset" filed Sep. 28, 2007, and assigned to the assignee hereof and hereby expressly incorporated by reference herein.

BACKGROUND

1. Field

The present disclosure generally relates to digital audio devices, and more particularly, to techniques for suppressing transient audio artifacts and reducing power consumption in audio devices.

2. Background

Digital audio devices are electronic devices that produce sound from digital information. They include, but are not limited to, radio receivers, stereo systems, computers, audio playback devices, such as MPEG-1 Audio Layer 3 (MP3) players; landline telephones, cellular phones, personal digital assistants (PDAs), satellite radio receivers, audio visual systems, such as video players, and the like.

Two performance considerations in digital audio devices are the presence of audible artifacts and power consumption.

An audible artifact is a perceivable noise introduced into the sound output from the audio device, frequently caused by operation of the audio device itself. Audible artifacts are usually undesirable and represent a deviation from the fidelity of the audio input to the device.

Click-and-pop is a specific type of audible artifact. Click-and-pop is an unpleasant audible artifact produced by a speaker, which is often heard when an audio device powers up or powers down. Click-and-pop is generally caused by an abrupt transient voltage, e.g., a direct current (DC) offset across a speaker that may occur when an audio power amplifier transitions between operational modes, such as a power-off mode and power-on mode. Other operational modes may include a shutdown mode, where power is still applied to the audio power amplifier, but the audio signal itself is discontinued within the device. Click-and-pop can sometimes be heard when the audio signal is discontinued or resumed, i.e., transitioning to or from the shutdown mode, respectively.

Click-and-pop can be especially annoying when using headsets with audio devices. It has become quite common for consumers to use telephones, including cellular and convention landline telephones, through headsets or headphones ("headsets" collectively). Similarly, headsets are usually used with audio playback devices, such as MP3 players. Headsets may be wired or wireless, for example, Bluetooth™-enabled headsets. Due to a headset's close proximity to a user's ears during use, headset click-and-pop can be greatly annoying or even harmful to hearing. Therefore, there is a need in the art to reduce or eliminate click-and-pop in digital audio devices.

Another criterion affecting the design of digital audio devices, particularly portable communication and entertainment devices, is power consumption. For example, expected battery life of a portable device is inversely related to the power consumed by the device. Therefore, there is also a need in the art to reduce the power consumption in voice communication and audio reproducing/playing devices.

SUMMARY

Disclosed herein is a new and improved approach to the problems of click-and-pop, and in some circumstances, power consumption in digital audio devices. The approach significantly reduces click-and-pop artifacts caused by operational mode transitions of an audio device, and can also reduce power consumption by audio amplifiers and speakers.

According to one aspect of the approach, an apparatus includes a digital processing portion configured to add a digital offset to a digitized audio signal. The digital offset is based on an output offset introduced into an analog audio signal by one or more analog components. The analog components are configured to produce the analog audio signal in response to the digitized audio signal.

According to another aspect of the approach, a method includes adding a digital offset to a digitized audio signal prior to the digitized audio signal being received by one or more analog components. The digital offset is based on an output offset introduced into an audio signal by the analog components.

According to another aspect of the approach, an apparatus includes means for storing a digital offset. The digital offset is based on an output offset introduced into an audio signal by one or more analog components. The apparatus also includes means for adding the digital offset to a digitized audio signal prior to the digitized audio signal being received by the analog components.

According to another aspect of the approach, a computer-readable medium embodying a set of instructions executable by one or more processors includes code for storing a digital offset, where the digital offset is based on an output offset introduced into an audio signal by one or more analog components. The computer-readable medium also includes code for adding the digital offset to a digitized audio signal prior to the digitized audio signal being received by the analog components.

According to another aspect of the approach, a device for suppressing transient audible artifacts includes digital circuitry configured to add a digital offset to a digitized audio signal. The device also includes analog circuitry configured to receive the digitized audio signal from the digital circuitry and to process the digitized audio signal to produce an analog audio signal. The digital offset is based on an output offset introduced into the analog audio signal by the analog circuitry.

According to another aspect of the approach, an apparatus includes a first digital processing portion configured to add a first digital offset to a first digitized audio signal corresponding to a left stereo channel, and a first analog processing portion configured to receive the first digitized audio signal from the first digital processing portion and to process the first digitized audio signal to produce an analog audio signal. The apparatus also includes a second digital processing portion configured to add a second digital offset to a second digitized audio signal corresponding to a right stereo channel, and a second analog processing portion configured to receive the second digitized audio signal from the second digital processing portion and to process the second digitized audio signal to produce an analog audio signal. The first digital offset is based on a first output offset introduced into the first analog audio signal by the first analog processing portion, and the second digital offset is based on a second output offset introduced into the second analog audio signal by the second analog processing portion.

Other aspects, features, and advantages of the disclosed approach will be or will become apparent to one with skill in the art upon examination of the following figures and detailed description. It is intended that all such additional features, embodiments, processes and advantages be included within this description and be protected by the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the apparatus and methods disclosed herein. In the figures, like reference numerals designate corresponding parts throughout the different views.

DETAILED DESCRIPTION

Figure 1:
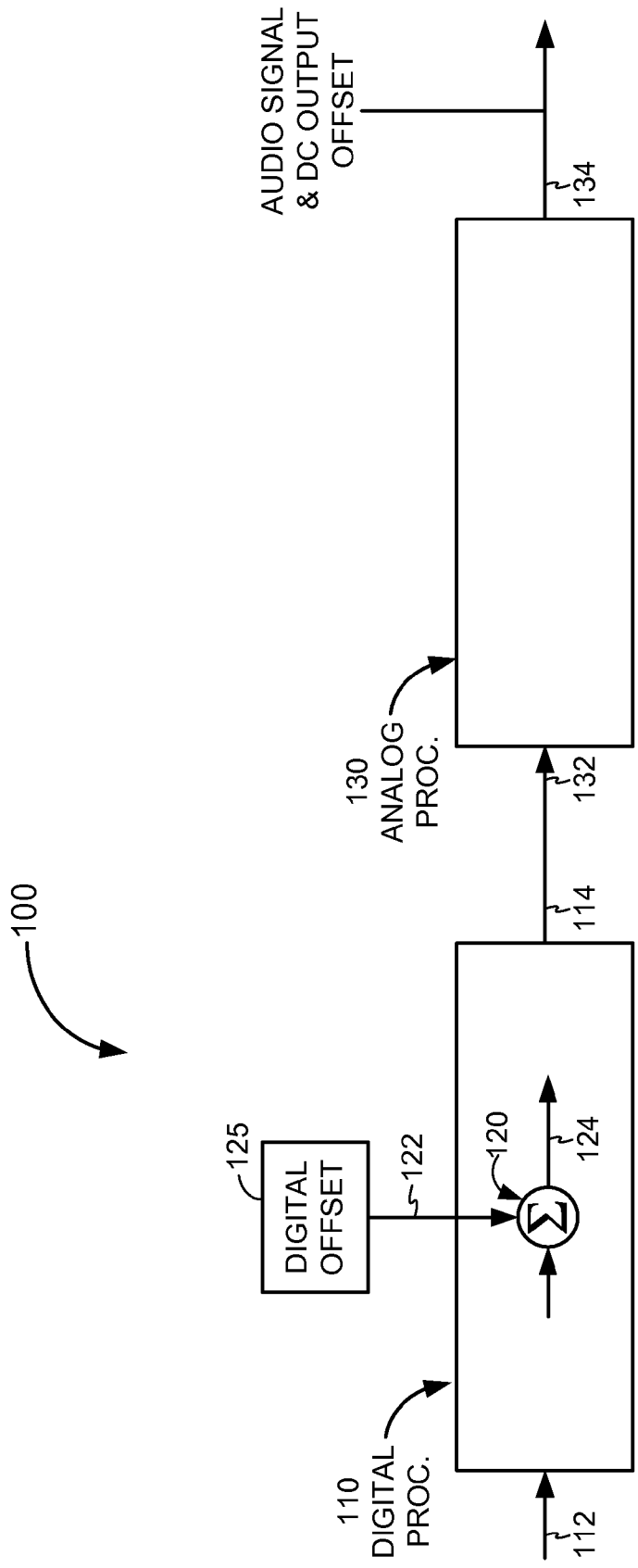
FIG. 1 is a conceptual block diagram illustrating certain components of an exemplary apparatus for reducing or eliminating output offset in an audio device.

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

For purposes of convenience and clarity only, directional terms, such as top, bottom, up, down, over, above, below, beneath, rear, and front may be used herein with respect to the accompanying drawings. These and similar directional terms should not be construed to limit the scope of the invention. The references to left and right channels relate to left and right sound stereo channels, and references to upper and lower paths are used to distinguish the paths by their relative locations on the drawings.

One reason for click-and-pop in some audio devices is the presence of a direct current (DC) offset voltage at the output of an analog domain portion of an audio signal path within the audio device. This output offset is typically caused by non-ideal performance of components within the analog portion of the audio signal path. Even when no audio signal is present at the input to the analog portion, the output offset may be present. Thus, when the audio device is powered up, the output of the audio path abruptly transitions from zero volts to some voltage determined by the output offset. This abrupt transient signal may result in click-and-pop. Likewise, when the audio device is powered down, the audio path output transitions from the output offset value to zero volts, also causing click-and-pop. Other modal changes can also cause click-and-pop due to the output offset.

Disclosed herein are one or more devices, apparatuses, methods, and articles of manufacture that insert a compensating digital offset into an digitized audio signal on an audio signal path in the digital domain to cancel estimated output offset caused by an analog domain of the audio signal path. In this way, the output offset at the output of the audio path, e.g., at the power amplifier output, is reduced or eliminated. Click-and-pop is thus reduced or eliminated altogether. In audio devices that operate in ground-referenced capless mode, power consumption is reduced because suppressing the output offset reduces or eliminates DC leakage current through speakers and/or headsets of such audio devices.

The devices, apparatuses, methods, and articles of manufacture described herein may be embodied in any suitable audio device including, but not limited to, radio receivers, stereo systems, computers, such as PCs or laptops, audio playback devices, such as MPEG-1 Audio Layer 3 (MP3) players, telephones, cellular phones, personal digital assistants (PDAs), satellite radio receivers, audio visual systems, such as video players, and the like. Audio processed and produced by the devices, apparatuses, methods, and articles of manufacture described herein may include any sound perceivable to the human ear or otherwise, such as voice, music, background sounds, noises and the like.

FIG. 1 is a conceptual block diagram illustrating certain components of an exemplary apparatus 100 for reducing or eliminating output offset in an audio device. The audio device is preferably a digital audio device that receives digital samples representing sound, and in turn processes the digital samples using digital and analog circuitry to generate sound output.

The apparatus 100 includes a digital processing portion 110 and an analog processing portion 130 configured to process audio signals on a audio signal path traversing through the audio device.

The digital processing portion 110 includes an input 112 configured to receive a digitally sampled sound stream (e.g., a digitized audio signal) and digital circuitry to process the digital audio sample stream in the digital domain. The digital samples represent discrete samples of an analog audio signal. The apparatus 100 is not limited to any particular digital audio format. The format of the sample stream depends upon the audio device in which the apparatus 100 is implemented, and thus, the sample stream may, in some circumstances, be raw audio samples, such as pulse code modulation (PCM) samples, or in other circumstances, digitally encoded and/or compressed audio, such MP3 audio.

The digital processing portion 110 further includes an output 114 and various circuitry for processing the digital audio stream. For example, the sampled audio stream may be truncated one or more times, filtered one or more times, amplified one or more times, and upsampled one or more times. Filtering may include low pass filtering, high pass filtering, and/or passing the stream through filters characterized by other kinds of filter functions. Amplification in the digital domain may include the use of a programmable gain amplifier (PGA).

As shown in FIG. 1, the digital processing portion 110 also includes a summer 120. The summer 120 is configured to add into the audio sample stream a digital offset. The digital offset is a digital value selected to cancel an estimated DC output offset caused by analog components in the analog processing portion 130. The summer 120 has an input 122 for receiving the digital offset, and an output 124. The digital offset may, in some circumstances, be a value stored in a memory 125 of the apparatus 100, such as in a memory of the digital processing portion 110 or in a memory of another block. The digital offset can comprise a predetermined number of bits, where the number of bits is based on gain applied to the audio signal by the analog processing portion. The summer 120 is configured to add into the audio sample stream the digital offset. The digital offset may be positive or negative, and it is based on the output offset. If the sampled audio stream in front of the summer 120 corresponds to (i.e., is a digital representation of) an analog, time-domain waveform S(t), and the digital offset at the input 122 corresponds to an analog value of OFFSET$_{DC}$, then the offset digital audio stream at the output 124 of the summer 120 would correspond to an analog audio waveform S(t)+OFFSET$_{DC}$.

More than one sampled audio stream may be processed in this way. For example, two stereo channels may be processed and offset, with each of the two channels receiving a different or the same digital offset value.

The summer 120 may be positioned at the front end of the digital processing portion 110, i.e., near or at the input 112. The summer 120 may also be positioned at the rear end of the digital processing portion 110, i.e., near or at the output 114. Furthermore, the summer 120 may be positioned anywhere else between these two extreme points of the digital processing portion 110.

The analog processing portion 130 includes an input 132 coupled to the output 114 of the digital processing portion 110, to receive the processed and offset digital audio stream. The analog processing portion 130 may optionally include digital circuitry to additionally process the stream in the digital domain. The analog processing portion 130 also includes circuitry to convert the offset digital audio stream to the analog domain, then process it still further in the analog domain, and finally output an analog audio signal through an output port 134. Digital processing in the analog processing portion 130 may include, for example, upsampling with a zero order hold (ZOH) circuit, and passing the stream through a sigma delta modulator (also known as sigma delta noise shaper). Conversion to the analog domain may be done by applying a data weighted averaging (DWA) algorithm, and driving a digital-to-analog converter (DAC) with the stream. One or more analog components perform the analog processing. An analog component is any electronic component that receives, processes and/or outputs analog information signals, as opposed to digital values. Processing in the analog domain may include passing the stream (which is now represented by one or more analog signals) through a low pass filter, such as a switched capacitor biquad filter.

The output port 134 may be coupled to a multiplexer (not shown), for switching between or among different output amplifiers that are generally known in the art. The different output amplifiers may include, for example, a line power management integrate circuit (PMIC) power amplifier, a line output power amplifier, a headphone (HPH) power amplifier, and an earphone power amplifier.

The DC output offset introduced into the audio signal path by the analog components of the analog processing portion 130 can be generally broken into two constituent parts: a systematic DC offset and a random DC offset. If the total DC offsets of a large number of analog processing portions made with the same process were to be analyzed statistically, they would be expected to form a normal distribution, as is generally the case with similar error statistics. However, a normal distribution of DC offsets in the analog processing portions made by the same process is not a requirement of the devices, apparatuses, methods and articles of manufacture disclosed herein. The systematic DC offset of a particular analog processing portion, for example, the portion 130, can then be thought of as the mean of the distribution, and the random DC offset can be thought of as the deviation from the statistical mean. The process used to make to analog processing portions can be characterized and the mean estimated from a production sample. Advantageously, the digital offset input into the summer 120 can be set so as to negate the systematic DC offset of the analog processing portion 130. In this way, the actual offset at the output of the analog processing portion 130 can be reduced or eliminated.

As has already been mentioned, the audio path apparatus 100 may be replicated for a second and subsequent sound channels, for example, right and left stereo channels. Moreover, the digital processing portion 110 may itself be configurable, with two or even more selectable internal paths, and with multiple summers for effecting digital offset into the digital audio sample stream. These concepts are illustrated in FIG. 2.

Figure 2:
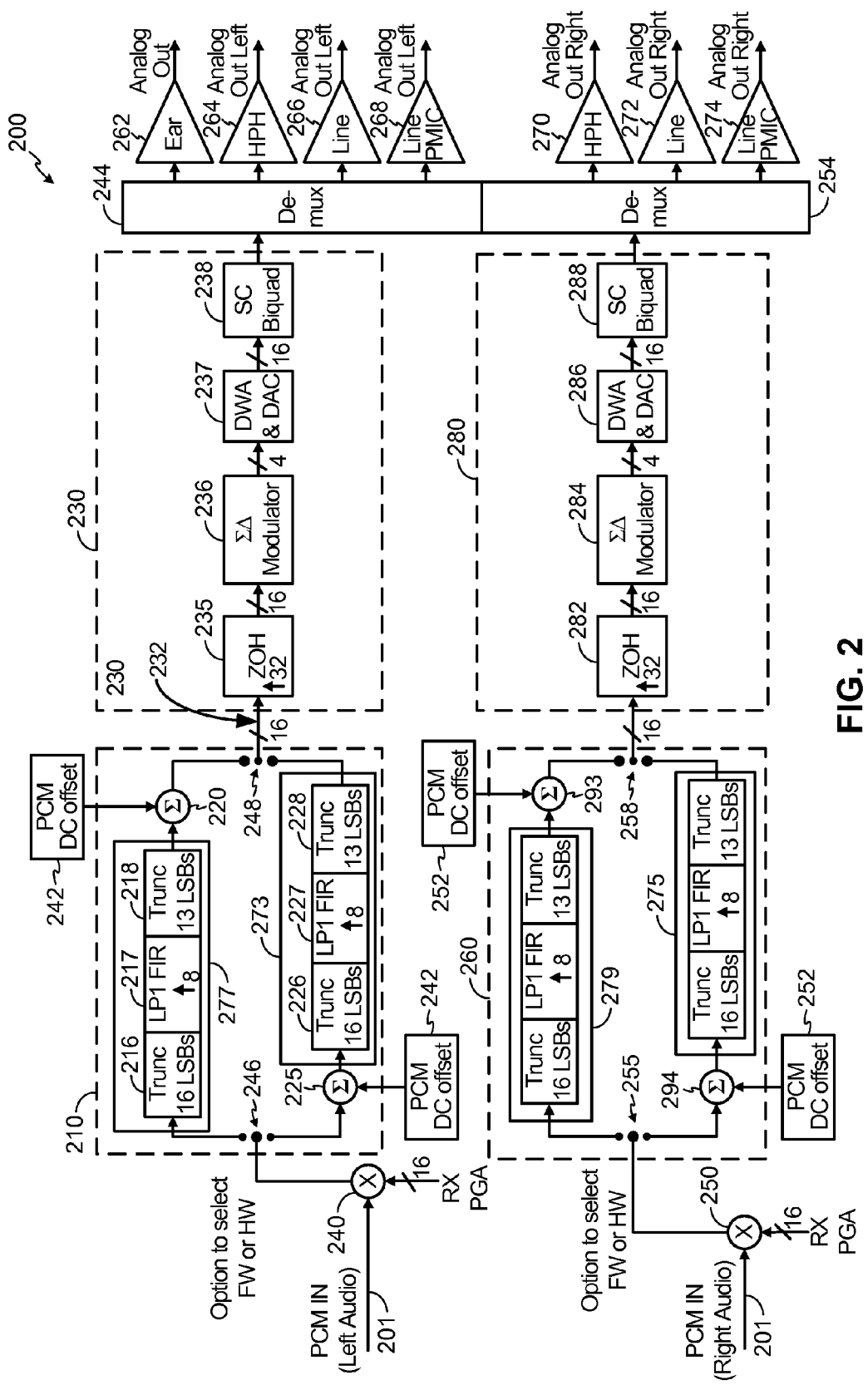
FIG. 2 a conceptual block diagram illustrating certain components of an exemplary audio device configured to reduce or eliminate output offset from an audio signal path.

FIG. 2 a conceptual block diagram illustrating certain components of an exemplary audio device 200 configured to reduce or eliminate output offset from an audio signal path. The audio signal path can be a receive path 201 of a coder/decoder (codec), which may be included in a digital audio device, such as a cellular access terminal (e.g., a cellular phone) with audio playback capability, e.g., MP3 playback. In this embodiment, the receive path 201 includes two parallel stereo channels, right and left. In the left channel, the apparatus includes a left digital processing portion 210 and a left analog processing portion 230. In the right channel, the apparatus includes a right digital processing portion 260 and a right analog processing portion 280.

In the exemplary audio device 200, the received left and right audio signals are preferably a stream of PCM signals. In each channel the PCM signals are amplified in the digital domain by left and right programmable gain amplifiers (PGAs) 240, 250, respectively. The Rx gain can be a 16-bit value.

There are effectively two signal paths in each of the digital processing portions 210 and 260. Each digital processing portion 210, 260 includes a hardware path 273 and 275, respectively, and a firmware path 277 and 279, respectively. The digital components of the hardware paths 273, 275 are implemented using hardware components, whereas the components of the firmware paths 277, 279 are implemented in software and/or firmware. Thus, the components of the firmware paths 277, 279 are programmable and changeable through software programming techniques.

The hardware and firmware paths are selectable; in other words, the digitized audio signal can be directed either through the firmware paths 277 and 279, or alternatively, through the hardware paths 273 and 275. A selector, such as switches 246, 248, 256, 258, allows selection of the respective hardware and firmware paths 273, 275, 277, 279. The switches 246, 256 can be de-multiplexers and the switches 248, 258 can be multiplexers, all under control of a state machine or processor configured to control operation of the audio device 200. Alternatively, the inputs and the outputs of the hardware and firmware paths 273, 275, 277, 279 can be memory mapped registers or memory locations that are readable/writable by the processor/state machine to effect the functions of the switches 246, 248, 256, 258. An advantage of having both hardware and firmware paths is that the digital processing portions 210, 260 are readily configurable and updateable (at least the firmware paths 277, 279) to handle different audio codec algorithms and schemes.

Focusing on the left channel digital processing portion 210, a first left summer 220 is at or near the end of the firmware path 277, which also includes truncators 216, 218 and a low pass (LP) finite impulse response (FIR) filter 217. A second left summer is located at or near the beginning of the hardware path 273. The hardware path 273 of the digital processing portion 210 includes truncators 226 and 228, and an LP FIR filter 227. In a particular embodiment, the LP FIR 217 and the LP FIR 227 may each have 225 taps. The truncators 216, 218, 226, 228 each truncate a digital sample to a given number of significant bits, discarding the least significant bits. In the examples shown, truncators 216 and 226 discard the 16 least significant bits of the samples, and truncators 218, 228 discard the 13 least significant bits of the samples.

The first and second left summers 220, 225 each add a digital offset to the audio samples. The digital offset is stored in a memory 242, and can be a PCM value representing the DC output offset introduced into the audio signal by the analog processing portion 230. The digital offset for each path 273, 277 may have the same value or different values. As described above in connection with the apparatus of FIG. 1, the digital offset compensates for output offset caused by the analog components of the respective downstream analog processing portion 230.

The output of the left channel digital processing portion 210 is connected to an input 232 of the left channel analog processing portion 230. The analog processing portion 230 includes a zero order hold circuit 235, a sigma delta modulator 236, a data weighted averaging algorithm in combination with a digital-to-analog converter (DAC) 237, and a switched capacitor biquad low pass filter 238. Note that the ZOH 235 and the sigma delta modulator 236 are implemented in hardware. The non-ideal operational characteristics of components in the analog processing portion 230, particularly analog components 237 and 238, introduce a DC output offset into the audio signal. The output offset is detectable at the output of the analog processing portion 230.

As can be seen from FIG. 2, arrangements and functionality of the right channel digital processing portion 260 and the right channel analog processing portion 280 are identical or analogous to the arrangements and functions of the left channel digital processing portion 210 and the left channel analog processing portion 230, respectively. The right channel digital processing portion 260 includes switches 256, 258, firmware path 279, and hardware path 275. The firmware path 279 includes truncators 290, 292, an LP FIR filter 291, and summer 293; the hardware path 277 includes truncators 295, 297, and an LP FIR filter 296, with summer 294 located at the beginning of the hardware path 275.

The summers 293, 294 each add a digital offset to the audio samples. The digital offset is stored in a memory 252, and can be a PCM value representing the DC output offset introduced into the right channel audio signal by the right channel analog processing portion 280. The digital offset for each path 275, 279 may have the same value or different values. As described above in connection with the apparatus of FIG. 1, the digital offset compensates for output offset caused by the analog components of the respective downstream analog processing portion 280.

The right channel analog processing portion 280 includes a zero order hold circuit 282, a sigma delta modulator 284, a data weighted averaging algorithm in combination with a digital-to-analog converter (DAC) 286, and a switched capacitor biquad low pass filter 288. These right channel components function in the same manner described above for the corresponding components of the left channel analog processing portion 230.

The analog audio signal outputs of the left and right channel analog processing portions 230, 280, are provided to de-multiplexers (DEMUXs) 244 and 254, respectively. The de-multiplexers 244, 254 selectively provide the left and right analog audio signals, respectively, to different audio power amplifier that include, for example, left and right line PMIC amplifiers 268, 274, line output power amplifiers 266, 272, and headphone (HPH) power amplifiers 264, 270. The left channel de-multiplexer 244 can also provide the audio signal to an earphone power amplifier 262.

Advantageously, each of the summers 220, 225, 293, 294 is preferably implemented in firmware and is placed at the interface between the hardware and firmware implemented components of the receive path 201. In this way, the hardware changes to preexisting components in the audio device 200 can be reduced when implementing the output offset reduction technique described herein.

The digital offsets may be the same or differ in value between left and right channels.

Figure 3:
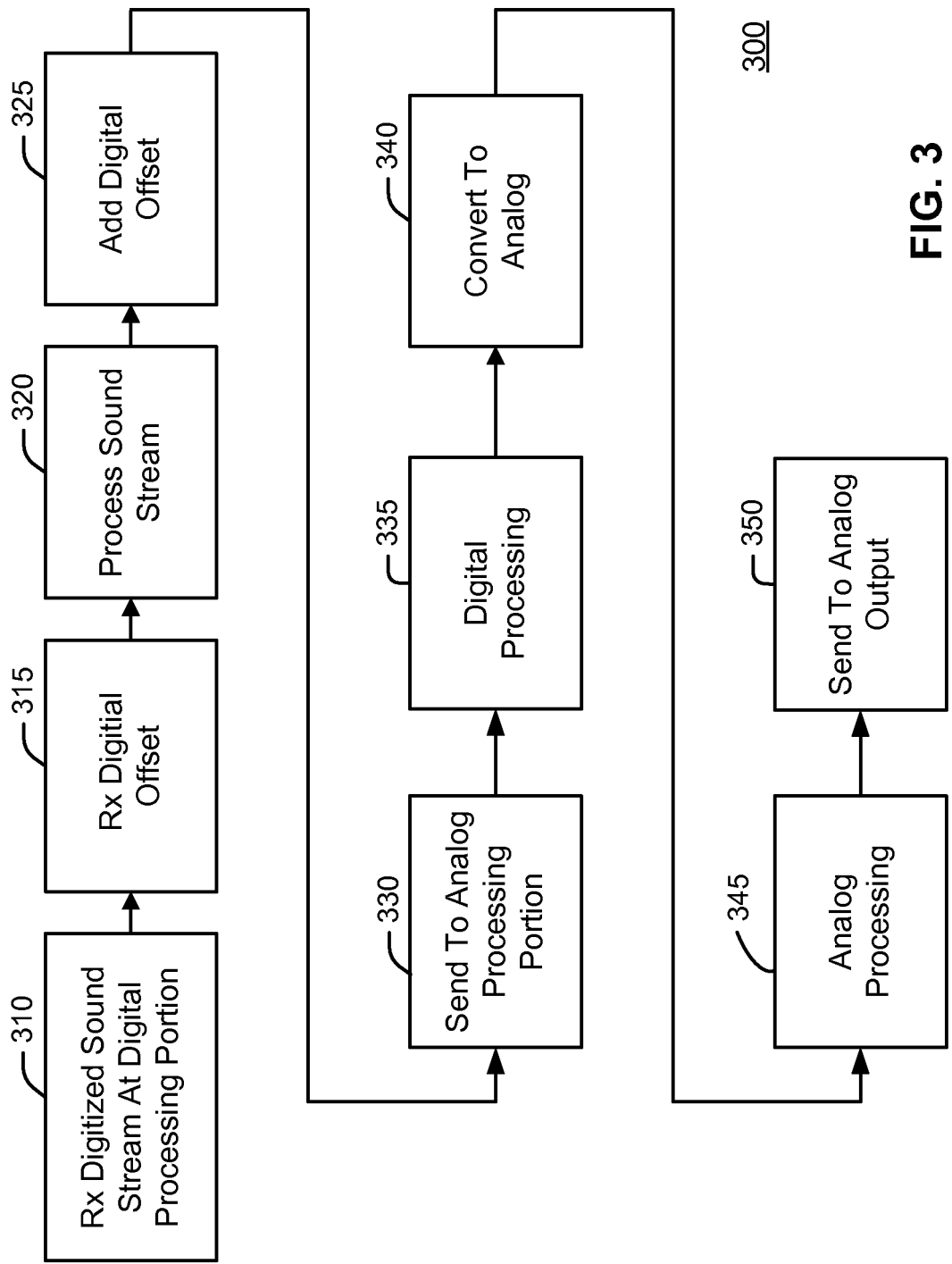
FIG. 3 is a process diagram illustrating a method for processing an audio signal to suppress undesirable audible artifacts caused by an output offset.

FIG. 3 is a process diagram illustrating an exemplary method 300 for processing an audio signal to suppress undesirable audible artifacts caused by an output offset. In step 310, a digitized audio stream is received in a digital processing portion configured to process the digitized audio stream, such as one of the elements 110, 210, or 260 in FIGS. 1 and 2. The digitized audio stream corresponds to an input analog audio stream.

At step 315, the digital processing portion also receives (or reads) a digital offset to be applied to the digitized audio stream. The digital processing portion may perform various processing functions on the digitized audio stream, such as upsampling and/or filtering, at step 320. The digital processing portion also adds the digital offset to the digitized audio stream, so that the processed digitized audio stream at the output of the digital processing portion corresponds to an offset and processed analog audio stream. This is done at step 325. The offset and processed audio stream at the output of the digital processing portion is a processed and offset version of the input analog audio stream. The offset and processed audio stream is then transmitted to an analog processing portion, at step 330. The offset and processed audio stream may be further processed in the digital domain by digital circuitry included within the analog processing portion, and then converted into an analog stream, at steps 335 and 340, respectively. The analog signal may be processed still further in the analog domain by one or more analog components included within the analog processing portion, in step 345. For example, the analog signal may be filtered. The analog signal may then be provided to an analog output for driving a headphone, earphone, speaker, and similar devices, at step 350.

Although the steps of the method in FIG. 3 have been described serially, some of these steps may be performed in parallel, in a pipelined manner, or otherwise. There is no particular requirement that the steps and decisions be performed in the same order in which this description lists them and FIG. 3 shows them, except where explicitly so indicated, otherwise made clear from the context, or inherently required, as would be apparent to one of ordinary skill in the art.

The application of digital offset to cancel systematic output offset may be phased out slowly over a period of time such that the phase out would not be noticeable to the user. Similarly, the digital offset may be introduced slowly before turning off the equipment, or before switching the mode of equipment, for example, when switching between telephone and player functions, or between different cellular systems. The slow phase out and introduction of the digital offset may be done in some variants. For example, the digital offset may be introduced and phased out linearly over a time period of 10 to 100 ms. But from a system point of view, it may be preferable to keep the digital offset applied at all or most times of operation, so that there is no need to wait before changing state or turning the audio device off. For example, a wait time on the order of 100 ms between switching states may be both noticeable and annoying to the user. Therefore, in some variants, the digital offset is applied at all or substantially all times of sound operation.

In audio devices operating in ground-referenced capless mode, power consumption is reduced by the application of the digital offset, because of the reduced or eliminated DC leakage through speakers or headsets of such devices. This is yet another reason for not phasing out digital offset. Each of the embodiments described herein may be specifically implemented to support a ground-referenced capless mode of operation. Ground-referenced capless audio output devices are well known in the art.

Figure 4:
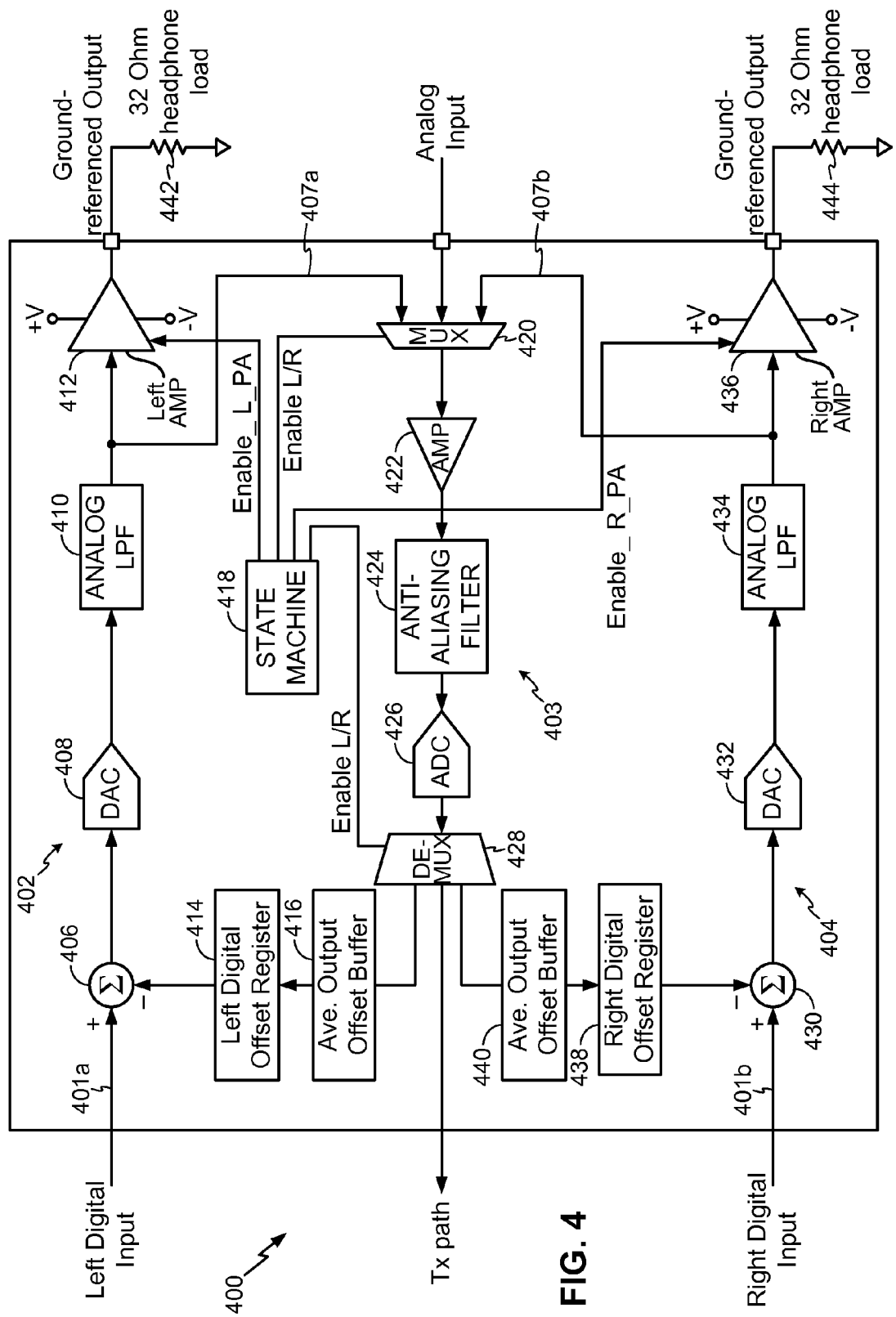
FIG. 4 a conceptual block diagram illustrating certain components of another exemplary audio device configured to reduce or eliminate output offset from an audio signal path.

FIG. 4 a conceptual block diagram illustrating certain components of another exemplary audio device 400 configured to reduce or eliminate output offset from an audio signal path 401a, 401b. The audio device 400 includes one or more feedback paths 403 for providing the output offset of the analog processing portion to the digital processing portion. The feedback path 403 allows the output offset to be measured and the corresponding digital offset to be dynamically updated in an individual audio device, rather than having a static digital offset based on a statistically determined estimation of the output offset. The digital offset can be periodically calculated and updated based on the measured output offset. For example, on power up, at mode changes and/or at predetermined intervals, the feedback path 403 can be used to measure the DC output offset at the analog portion output and update the digital offset. Thus, the feedback path 403 may allow for more accurate suppression of the output offset.

The audio signal path 401a, 401b can be a receive path of a codec, which may be included in a digital audio device, such as a cellular access terminal (e.g., a cellular phone) with audio playback capability, e.g., MP3 playback. The receive path includes two parallel stereo channel paths, right 401b and left 401a. The received left and right audio signals are preferably streams of PCM signals. In the left channel path, the audio device 400 includes a left channel processing portion 402, which includes a left channel summer 406, a digital-to-analog converter (DAC) 408, an analog low-pass filter (LFP) 410, a left HPH amplifier (Amp) 412, a left output offset register 414, and a left average output offset buffer 416. In the right channel path, the audio device 400 includes a right channel processing portion 404, which includes a right channel summer 430, a DAC 432, an analog LFP 434, a right HPH amplifier (Amp) 436, a right output offset register 438, and a right average output offset buffer 440. The right and left channels paths can include additional digital and/or analog components, such as those discuss above in connection with FIGS. 1 and 2.

The left and right channel summers 406, 430 can each function and be implemented in the same manner as described above for summers 220, 225, 293, 294 shown in FIG. 2.

The example feedback path 403 shown in FIG. 4 includes a MUX 420, an amp 422, an anti-aliasing filter 424, an analog-to-digital converter (ADC) 426, and a de-multiplexer (DEMUX) 428. The feedback path 403 can be part of or share components with a transmit (Tx) path through a codec.

The state machine 418 controls operation of the feedback path 403, measurement and processing of the output offset, and determination of the digital offset. The state machine 418 can be implemented using any suitable combination of hardware and/or software technology. Preferably, the state machine 418 is implemented in software/firmware executing on a processor.

As input, the feedback path 403 can selectively receive through the MUX 420 either the left channel output offset on line 407a, the right channel output offset on line 407b, or a Tx analog audio input, such as input from a microphone. The output of the feedback path 403 can be selectively provided to the left average output offset buffer 416, the audio Tx path, or the right average output offset buffer 440, through the DEMUX 428. The MUX 420 and DEMUX 428 are controlled by the state machine 418 through enable signals (Enable L/R).

Prior to enabling the right and left headphone amps 436, 412 (using Enable_R_PA and Enable_L_PA signals, respectively), the state machine 418: 1) sets the MUX 420 and DEMUX 428 to route the left channel analog LPF output on line 407a through MUX 420, amp 422, anti-aliasing filter 424, ADC 426, and DEMUX 428 to the left average output offset buffer 416; 2) waits a predefined period of time to allow the left channel output offset to propagate through the feedback path 403 (e.g., 10 milliseconds); 3) latches the measured output offset value at the output of the ADC 426 into the left average output offset buffer 416; 4) averages the DC output offset value over a predetermined number of output offset samples or period of time; and 5) sets the left output offset register 414 to the average output offset value finally computed and placed in the buffer 416.

The above steps 1-5 are repeated for the right channel using the right channel output offset measured on line 407b, resulting in the right digital offset register 438 being loaded with a right channel average output offset value. After loading both the left and right output offset registers 414, 438, the state machine 418 waits a predefined period of time to allow offset audio signals on both left and right channels to propagate through to the outputs of the respective analog LPFs 410, 434. The state machine 418 then sets the MUX 420 and DEMUX 428 to enable the audio input (e.g., microphone input) to flow through the feedback path components to the Tx path. The state machine 418 then enables the left and right HPH amps 412, 436 to provide offset audio signals to the respective headphones 442, 444.

The digital offset can be adjusted by the state machine 418 to compensate for alterations to the audio signal by analog components. For example, the digital offset can comprise a predetermined number of bits, where the number of bits is based on gain applied to the audio signal by the analog components.

Although described above in connection with a two channel audio device, the technique of feeding back a measured output offset can be applied to a single audio channel device.

The apparatus 100, audio devices 200, 400 and method 300 described above may each be included in an access terminal, which also may be referred to as AT, subscriber station, user equipment, UE, mobile terminal, MT, or cellular communication device, may be mobile or stationary, and may communicate with one or more base transceiver stations. An access terminal may be any of a number of types of devices, including but not limited to personal computer (PC) card, external or internal modem, wireless telephone, and personal digital assistant (PDA) with wireless communication capability. An access terminal transmits and receives data packets to or from a radio network controller through one or more base transceiver stations.

Some cellular access terminals can communicate with different kinds of communication networks, for example, with both CDMA networks and Global System for Mobile communications (GSM) networks. Some access terminals may also provide additional audio-related functionality, such as audio playback.

A CDMA system may be designed to support one or more CDMA standards, such as (1) the "TIA/EIA-95 Mobile Station-Base Station Compatibility Standard for Dual-Mode Wideband Spread Spectrum Cellular System" (this standard with its enhanced revisions A and B may be referred to as the "IS-95 standard"), (2) the "TIA/EIA-98-C Recommended Minimum Standard for Dual-Mode Wideband Spread Spectrum Cellular Mobile Station" (the "IS-98 standard"), (3) the standard sponsored by a consortium named "3rd Generation Partnership Project" (3GPP) and embodied in a set of documents known as the "W-CDMA standard," (4) the standard sponsored by a consortium named "3rd Generation Partnership Project 2" (3GPP2) and embodied in a set of documents including "TR-45.5 Physical Layer Standard for cdma2000 Spread Spectrum Systems," the "C.S0005-A Upper Layer (Layer 3) Signaling Standard for cdma2000 Spread Spectrum Systems," and the "TIA/EIA/IS-856 cdma2000 High Rate Packet Data Air Interface Specification" (the "cdma2000 standard" collectively), (5) the 1xEV-DO standard, and (6) certain other standards.

The various methods, apparatuses, components, functions, state machines, devices and circuitry described herein may be implemented in hardware, software, firmware or any suitable combination of the foregoing. For example, the methods, apparatuses, components, functions, state machines, devices and circuitry described herein may be implemented, at least in part, with one or more general purpose processors, digital signal processors (DSPs), application specific integrated circuits (ASICs), field programmable gate arrays (FPGAs), intellectual property (IP) cores or other programmable logic devices, discrete gates or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The functions, state machines, components and methods described herein, if implemented in software, may be stored or transmitted as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer processor. Also, any transfer medium or connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above are also included within the scope of computer-readable media.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

What is claimed is:

1. An apparatus, comprising:
    a digital processing portion including:
    a first truncator;
    a filter configured to receive output from the first truncator;
    a second truncator configured to receive output from the filter; and
    a summer to add a digital offset to a digitized audio signal output from the second truncator, wherein the digital offset is based on an output offset introduced into an analog audio signal by one or more analog components configured to produce the analog audio signal in response to the digitized audio signal.

2. The apparatus of claim 1, wherein the digital offset corresponds to the negative of the output offset.

3. The apparatus of claim 1, wherein the output offset is a predetermined systematic DC offset.

4. The apparatus of claim 1, further comprising:
    a feedback path configured to provide the output offset to the digital processing portion.

5. The apparatus of claim 4, further comprising:
    an analog-to-digital converter (ADC) included in the feedback path, configured to convert the output offset to a digital value.

6. The apparatus of claim 1, further comprising:
    an offset measuring portion configured to determine the output offset upon initialization of the apparatus.

7. The apparatus of claim 1, wherein the digital processing portion comprises:
    a firmware path;
    a hardware path; and
    a selector configured to select either the firmware path or the hardware path for processing the digitized audio signal.

8. The apparatus of claim 1, further comprising:
    an audio amplifier configured to receive the audio signal from at least one of the analog components.

9. The apparatus of claim 1, further comprising:
    a multiplexer configured to receive the audio signal output from at least one of the analog components; and
    a plurality of audio amplifiers configured to selectively receive the audio signal from the multiplexer.

10. The apparatus of claim 1, further comprising a programmable gain amplifier (PGA) configured to amplify the digitized audio signal.

11. An apparatus, comprising:
    means for storing a digital offset, wherein the digital offset is based on an output offset introduced into an audio signal by one or more analog components; and means for adding the digital offset to a digitized audio signal prior to the digitized audio signal being received by the analog components to produce an offset digitized audio signal;
means for converting the offset digitized audio signal into an analog audio signal using a multi-bit digital-to-analog converter (DAC).

12. The apparatus of claim 11, wherein the digital offset corresponds to the negative of the output offset.

13. The apparatus of claim 11, further comprising:
means for measuring the output offset upon initialization of the analog components; and
means for converting the output offset to the digital offset.

14. The apparatus of claim 13, further comprising:
feedback means for providing the output offset to the storing means.

15. The apparatus of claim 11, further comprising:
means for selecting either a firmware path or a hardware path within a digital processing portion for processing the digitized audio signal.

16. A device for suppressing transient audible artifacts, comprising:
digital circuitry configured to add a digital offset to a digitized audio signal to produce an offset digitized audio signal;
a digital-to-analog converter (DAC) receiving the offset digitized audio signal; and
analog circuitry configured to receive output from the DAC and to process the output to produce an analog audio signal; wherein the analog circuitry includes an amplifier in ground-referenced mode for amplifying the analog audio signal;
wherein the digital offset is based on an output offset introduced into the analog audio signal by the analog circuitry.

17. The device of claim 16, wherein the digital offset corresponds to the negative of the output offset.

18. The device of claim 16, wherein the digital circuitry comprises:
a firmware path;
a hardware path; and
a selector configured to select either the firmware path or the hardware path for processing the digitized audio signal.

19. The device of claim 16, further comprising:
a feedback path from the analog circuitry to the digital circuitry, configured to provide the output offset to the digital circuitry.

20. The device of claim 19, further comprising:
an analog-to-digital converter (ADC) included in the feedback path, configured to convert the output offset to a digital value.

21. The device of claim 16, further comprising:
a multiplexer configured to receive the audio signal output from the analog circuitry; and
a plurality of audio amplifiers configured to selectively receive the audio signal from the multiplexer.

22. An apparatus, comprising:
a first digital processing portion configured to add a first digital offset to a first digitized audio signal corresponding to a left stereo channel;
a first analog processing portion configured to receive the first digitized audio signal from the first digital processing portion and to process the first digitized audio signal to produce an analog audio signal, the first analog portion including a first audio amplifier in ground-referenced mode for amplifying the analog audio signal, a first filter having a first output and means for providing the first output as the first digital offset;
a second digital processing portion configured to add a second digital offset to a second digitized audio signal corresponding to a right stereo channel; and
a second analog processing portion configured to receive the second digitized audio signal from the second digital processing portion and to process the second digitized audio signal to produce an analog audio signal, the second analog portion including a second audio amplifier in ground-referenced mode for amplifying the analog audio signal, a second filter having a second output and means for providing the second output as the second digital offset;
wherein the first digital offset is based on a first output offset introduced into the first analog audio signal by the first analog processing portion;
wherein the second digital offset is based on a second output offset introduced into the second analog audio signal by the second analog processing portion.

23. The apparatus of claim 22, wherein the first digital offset corresponds to the negative of the first output offset; and
wherein the second digital offset corresponds to the negative of the second output offset.

24. The apparatus of claim 11, further comprising: means for averaging a plurality of measured offset values to obtain the digital offset.

25. The apparatus of claim 11, further comprising: means for amplifying the analog audio signal in ground-reference mode.

26. The device of claim 16, wherein the analog circuitry includes an amplifier in ground-reference mode for amplifying the analog audio signal.

27. The device of claim 16, wherein the analog circuitry includes a low-pass filter (LPF) having an output measured to obtain the digital offset.

28. An apparatus, comprising:
a digital processing portion including:
a summer to add a digital offset to a digitized audio signal;
a first truncator receiving output from the summer;
a filter configured to receive output from the first truncator; and
a second truncator configured to receive output from the filter;
wherein the digital offset is based on an output offset introduced into an analog audio signal by one or more analog components configured to produce the analog audio signal in response to the digitized audio signal.

29. The apparatus of claim 28, further comprising:
a feedback path configured to provide the output offset to the digital processing portion.

30. The apparatus of claim 29, further comprising:
an analog-to-digital converter (ADC) included in the feedback path, configured to convert the output offset to a digital value.

31. The apparatus of claim 28, further comprising:
an offset measuring portion configured to determine the output offset upon initialization of the apparatus.

32. The apparatus of claim 28, wherein the digital processing portion comprises:
a firmware path;
a hardware path; and
a selector configured to select either the firmware path or the hardware path for processing the digitized audio signal.

33. An apparatus, comprising:
a digital processing portion configured to add a digital offset to a digitized audio signal, wherein the digital offset is based on an output offset introduced into an analog audio signal by one or more analog components configured to produce the analog audio signal in response to the digitized audio signal; and
an analog processing portion including the analog components, comprising:
a zero-order hold circuit;
a sigma-delta modulator configured to receive output from the zero-order hold circuit;
a digital-to-analog converter (DAC) configured to receive output from the sigma-delta modulator; and
a filter configured to receive output from the DAC.

34. The apparatus of claim 33, further comprising:
a feedback path configured to provide the output offset to the digital processing portion.

35. The apparatus of claim 34, further comprising:
an analog-to-digital converter (ADC) included in the feedback path, configured to convert the output offset to a digital value.

36. The apparatus of claim 33, further comprising:
an offset measuring portion configured to determine the output offset upon initialization of the apparatus.

37. The apparatus of claim 33, wherein the digital processing portion comprises:
a firmware path;
a hardware path; and
a selector configured to select either the firmware path or the hardware path for processing the digitized audio signal.

* * * * *